United States Patent [19]
Huang

[11] Patent Number: 6,111,813
[45] Date of Patent: Aug. 29, 2000

[54] APPARATUS AND METHOD FOR TRACKING DYNAMIC SENSE AMPLIFIER ENABLE SIGNALS WITH MEMORY ARRAY ACCESSING SIGNALS IN A SYNCHRONOUS RAM

[75] Inventor: Eddy C. Huang, San Jose, Calif.

[73] Assignee: Winbond Electronics Corporation, Hsin-Chu, Taiwan

[21] Appl. No.: 08/940,384

[22] Filed: Sep. 30, 1997

[51] Int. Cl.$^7$ .............. G06F 12/00; G11C 7/00; G11C 7/02
[52] U.S. Cl. .............. 365/233.5; 365/207; 365/205; 365/230.06; 365/196; 711/104; 711/105
[58] Field of Search .................... 711/104, 105; 365/154, 189.01, 181.01, 205, 230.05, 230.06, 230.08, 207, 233.5, 196

[56] References Cited

U.S. PATENT DOCUMENTS

| | | | |
|---|---|---|---|
| 5,532,969 | 7/1996 | Houghton | 365/226 |
| 5,619,466 | 4/1997 | McClure | 365/207 |
| 5,657,277 | 8/1997 | Shirley | 365/189.07 |
| 5,724,292 | 3/1998 | Wada | 365/207 |
| 5,748,554 | 5/1998 | Barth et al. | 365/230.06 |
| 5,802,004 | 9/1998 | McClure | 365/230.03 |
| 5,867,449 | 2/1999 | Casper | 365/233.5 |

Primary Examiner—Eddie P. Chan
Assistant Examiner—Kimberly McLean
Attorney, Agent, or Firm—Burns, Doane, Swecker & Mathis, L.L.P.

[57] ABSTRACT

An apparatus and method of tracking accesses in a synchronously accessed memory system so as to enable dynamic sense amplifiers for sensing data at optimal times is described. In one case, the apparatus is used to enable dynamic sense amplifiers in a SRAM in which a memory cell or memory cells within the memory array are accessed by a global word line and one or more sub-word lines. The apparatus includes detection circuitry for detecting when particular GWL and SWL lines are selected and enable circuitry for enabling the appropriate sense amplifier in response to the detection circuitry. Since the enable circuitry for each sense amplifier is responsive to the accessing signals for the particular cell or cells being accessed, the sense amplifier corresponding to the cell or cells being accessed will be enabled at the proper time for reading data from the accessed cell or cells so as to avoid erroneous early reading of data and to avoid delaying reading data to ensure that it is ready.

6 Claims, 5 Drawing Sheets

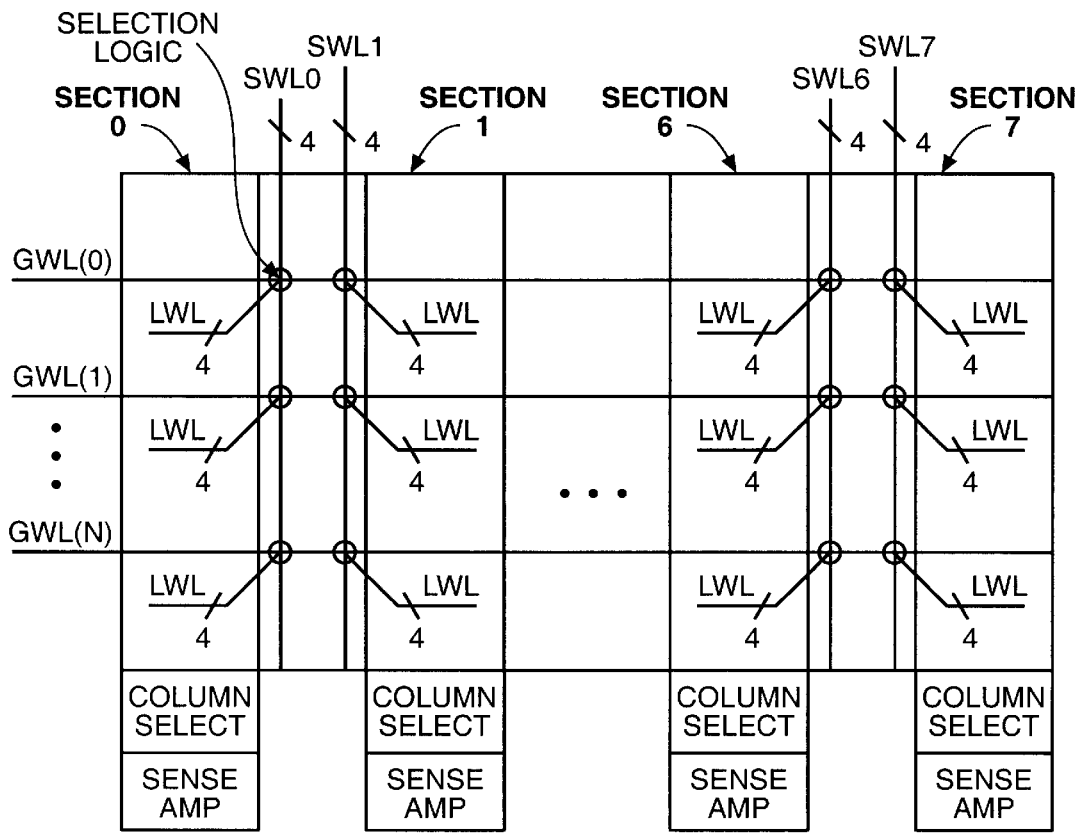
FIG._1A *(PRIOR ART)*

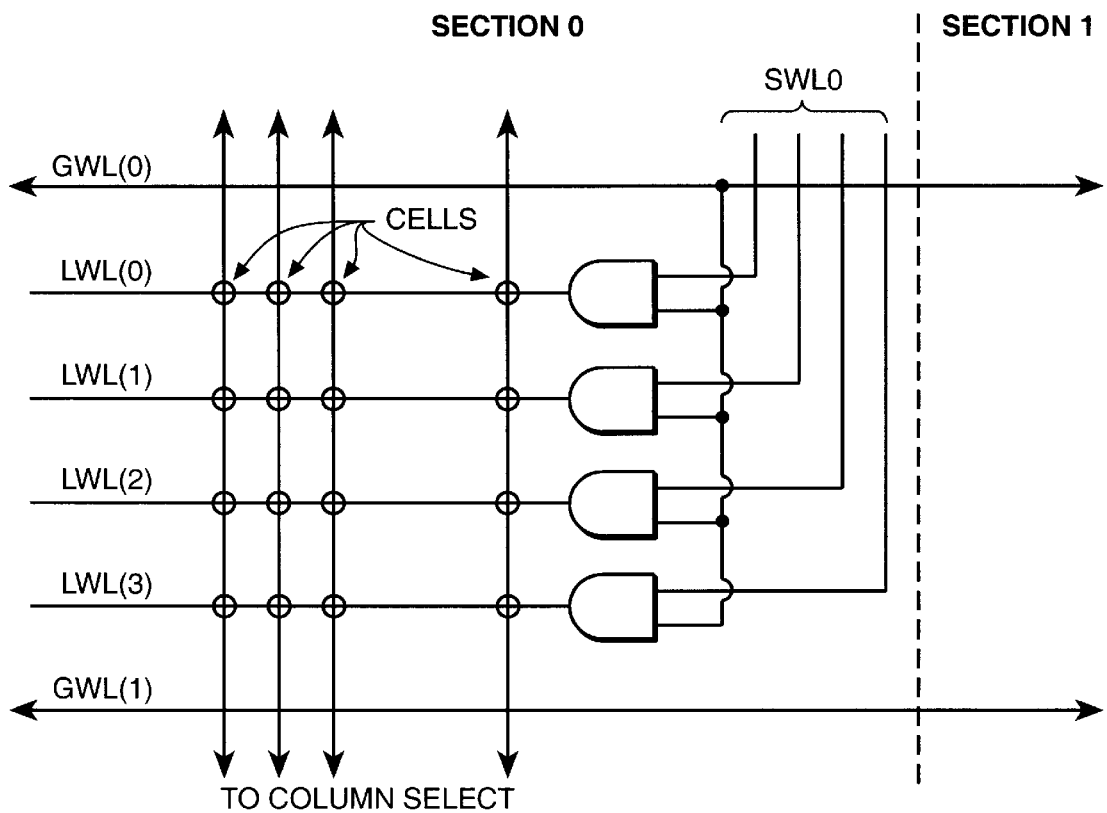
FIG._1B *(PRIOR ART)*
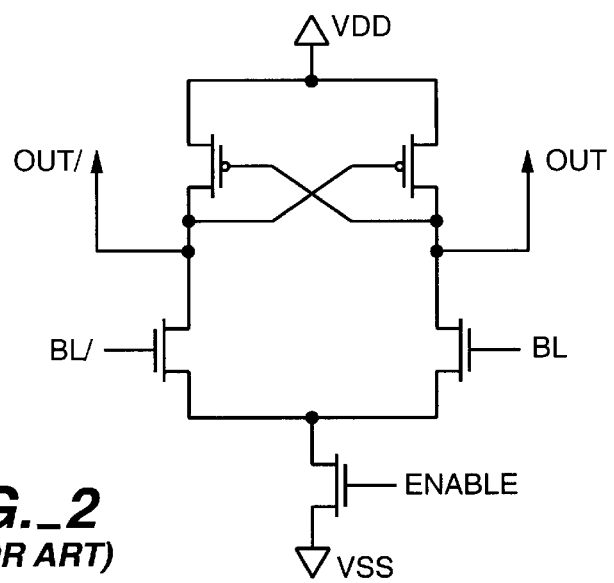
FIG._2
*(PRIOR ART)*

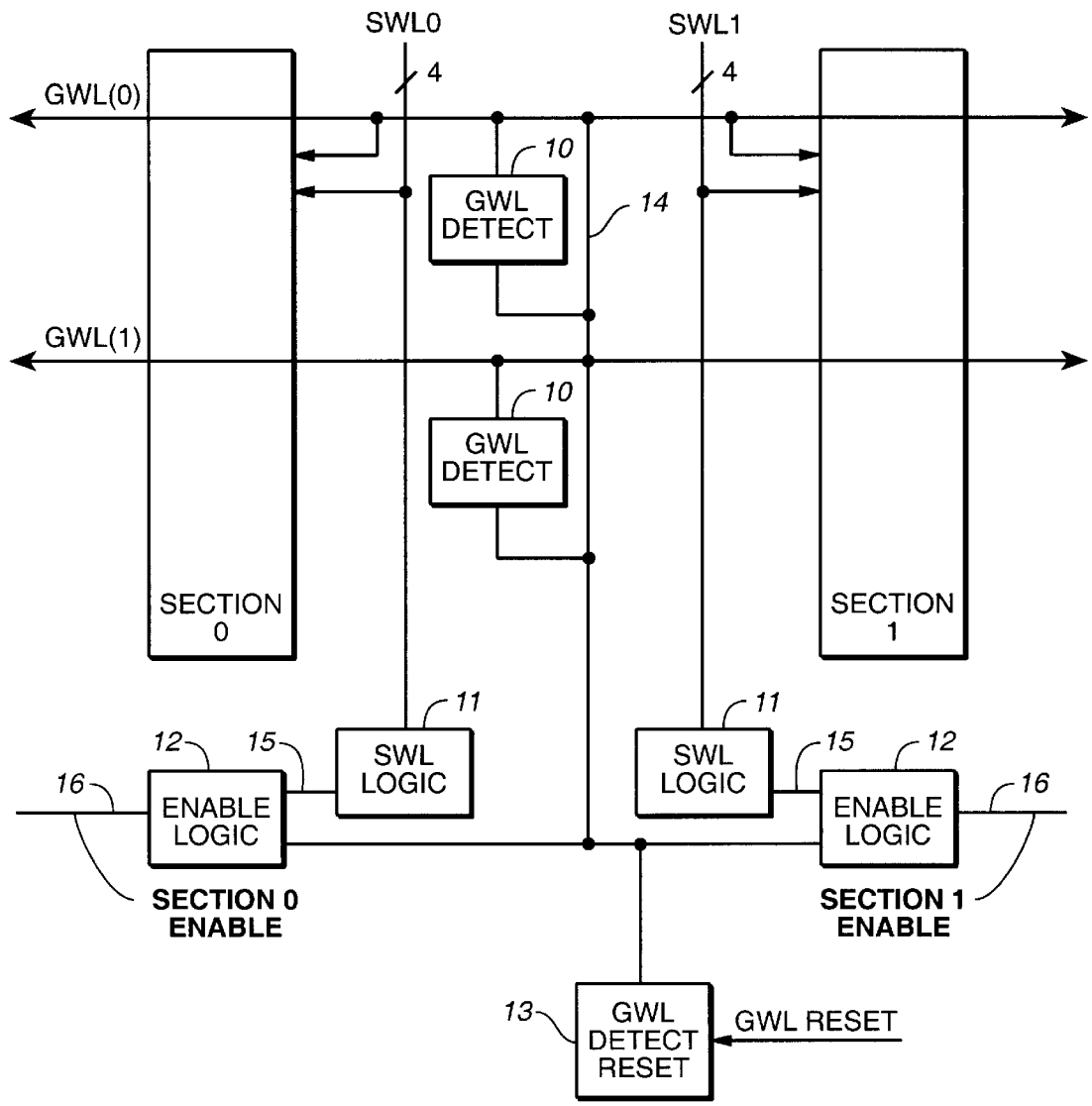
FIG._3

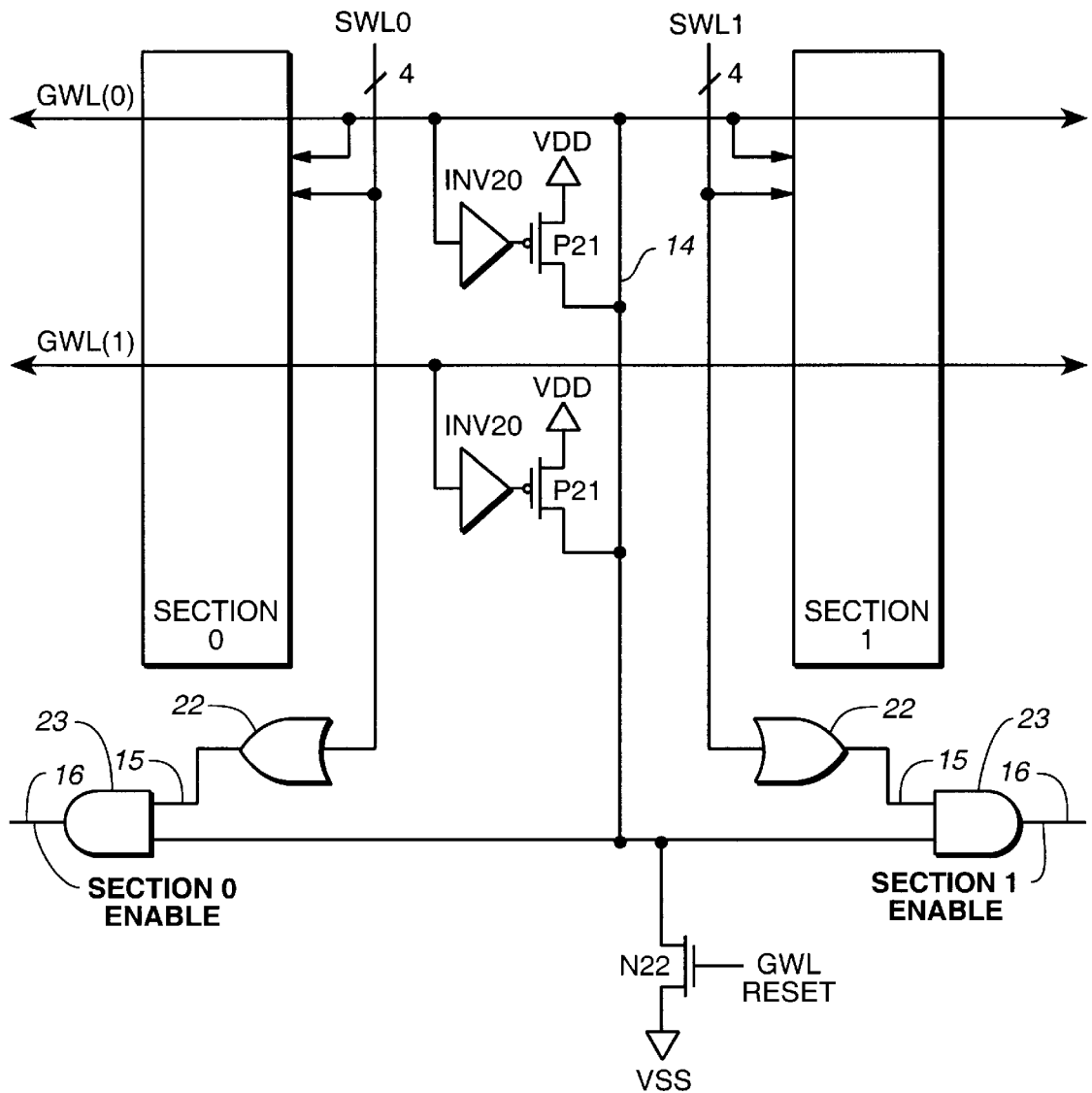
FIG._4

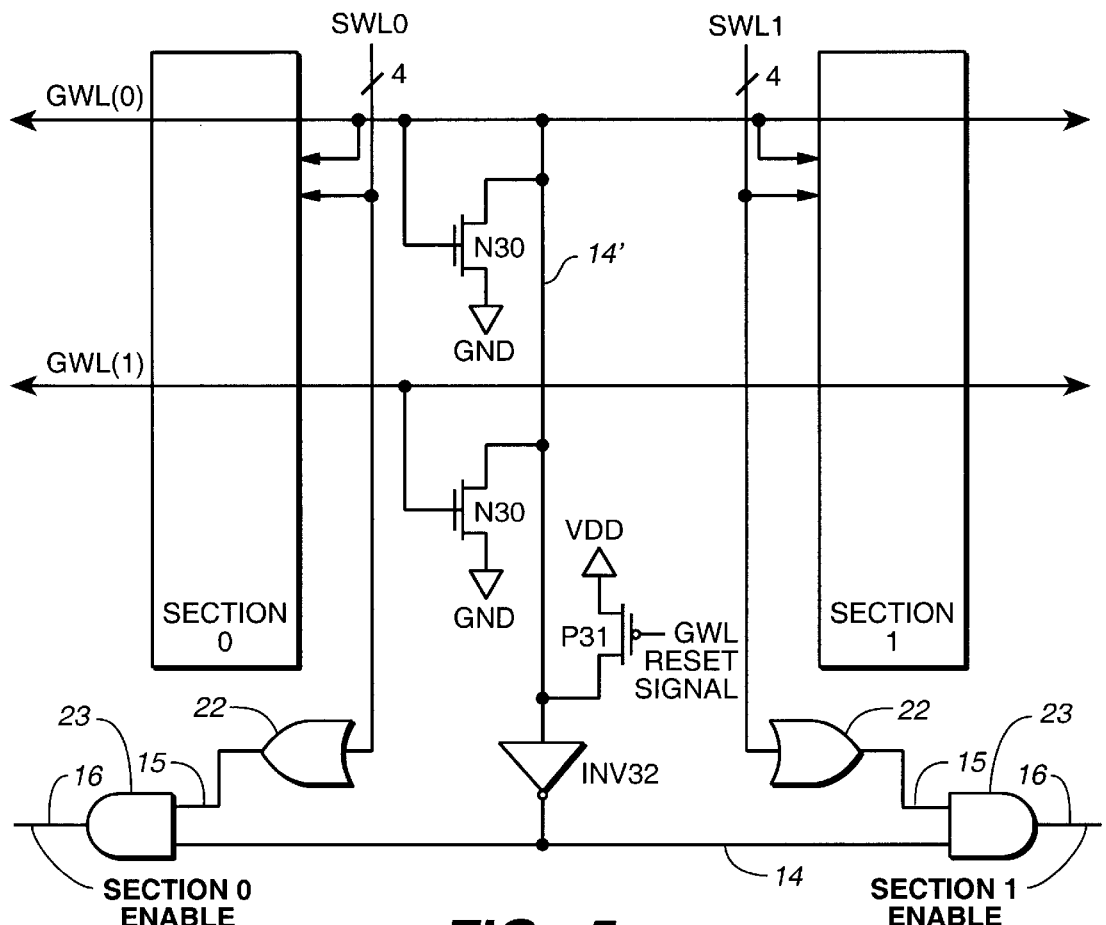
FIG._5
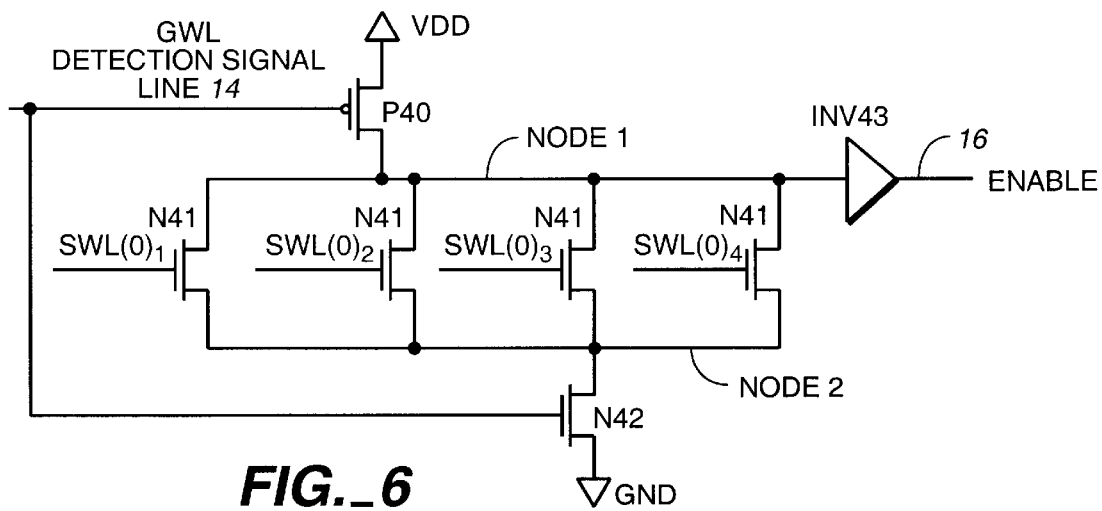
FIG._6

APPARATUS AND METHOD FOR TRACKING DYNAMIC SENSE AMPLIFIER ENABLE SIGNALS WITH MEMORY ARRAY ACCESSING SIGNALS IN A SYNCHRONOUS RAM

BACKGROUND OF THE INVENTION

1. Field of the Invention

The present invention relates to synchronous RAMs and particularly to the timing of the enable signal provided to a dynamic sense amplifier in a synchronous RAM.

2. State of the Art

Synchronous (i.e. clocked) memory systems, and particularly synchronous random access memories are designed for speed and low power consumption. Specifically, whereas non-clocked memory systems apply input address signals at various times to the memory inputs within a given time interval resulting in relatively slow response times and delays, synchronous memory systems clock input address signals to the memory inputs with minimal delays.

Another manner in which synchronous RAMs are optimized for speed and power consumption is the manner in which the memory array is organized. For instance, a basic memory array is arranged into rows and columns of memory cells. The memory cells are accessible by selecting the intersection of a word (i.e. row) line and column line of a memory cell within the array. The problem with this type of design is that in a N row x M column array each word line is coupled to M cells and particularly to the gate of an MOS device in each cell. The combination of the gate capacitance of these MOS devices and the parasitic resistance of long word lines results in a significant RC constant associated with each word line, resulting in slow signal propagation on the word line, and hence overall slow memory system operation.

FIG. 1A shows one manner in which this capacitive loading effect is avoided in the memory array of a synchronous RAM. In order to reduce the number of capacitive elements coupled to the word line of a memory array, the array is divided into sections of columns (e.g. section 0, section 1 through section 7) and instead of using a word line to access each of the cells in a given row, a group of local word lines (LWL) in each of the sections are accessed by a global word line (GWL). A sub-word line (SWL) selects the particular LWL in the section. For example, to access a cell in section 0 on one of the LWL lines selectable by GWL(0), GWL(0), one of the SWLOs, and a column needs to be selected. FIG. 1B shows the logic used to access one of the LWLs using SWL and GWL accessing signals which includes one or more logic gates (e.g. AND gates in FIG. 1B). When GWL(0) and one of the SW0 lines are selected, one of the LWLs will also be selected. The selected column then determines which cell is accessed. Referring to FIGS. 1A and 1B, in the case of the N row x M column array in which the columns have been divided into eight sections, the loading on the global word line has been reduced from M cells to 32 AND gates. This represents a significant reduction in capacitive loading of the word line thereby reducing delays within the circuit. It should be noted that FIGS. 1A and 1B do not show actual memory cells or bit lines from memory cells and instead primarily illustrates the access circuitry and signals used to access the memory cells in the array. However, it is well understood in the industry that each memory cell includes a bit line or lines which couple to the sense amplifier in order to read the data from each cell once it has been accessed.

Still another manner in which to optimize power and speed performance in a synchronous RAM is to use dynamic sense amplifiers which are fast and do not dissipate any quiescent (i.e. idle) power. FIG. 2 shows an example of a typical fully differential dynamic sense amplifier having two inputs coupled to the BIT and BIT/ lines from a cell in the array. A sense amplifier enable signal (ENABLE) which is synchronized with a system clock edge, is applied to the sense amplifier causing it to latch to its output ports OUT and OUT/ whatever logic level is present on the BIT and BIT/ inputs of the amplifier at the time the enable signal is applied. Any changes to the BIT and BIT/ lines after the application of the latch enable signal has no affect on the output of the dynamic sense amplifier. As a result, applying the enable signal prior to when the BIT and BIT/ signals are ready would produce erroneous outputs. Alternatively, delaying the enable signal to ensure that the BIT and BIT/ inputs are ready results in increased read access times.

The problem with using dynamic sense amplifiers, global word lines and sub-word lines within a synchronous RAM design is that the GWL and SWL can introduce variable access times to the cells due to variable signal propagation delays on these lines when accessing the array and as a result, the optimal time to apply the enable signal to the dynamic sense amplifier can also vary. Consequently, in current synchronous RAM designs, the enable signal, which is currently synchronized to the system clock edge, is delayed to allow for a worst case access time in order to ensure that the BIT and BIT/ lines are ready to be read. In this way, any signal propagation delays due to process and temperature variations within a given tolerance window are accounted for. However, this is a less than optimal design since the BIT and BIT/ signals may be ready prior to the delayed sense amplifier enable signal being applied depending on the particular device's operating temperature and its previous processing conditions.

What is needed is a synchronous RAM design using a dynamic sense amplifier in which the enable signal is provided to the sense amplifier at the optimal time for reading the bit lines of the array.

SUMMARY OF THE INVENTION

The present invention, in general, is a synchronous RAM design in which dynamic sense amplifiers within the RAM are enabled in response to accessing signals used to access the array. In one embodiment, the synchronous RAM of the present invention includes an array of memory cells, accessing lines to access the memory cells in the array, sense amplifiers coupled to the array for sensing the data stored in the memory cells when it is accessed using the accessing lines, and control logic that is responsive to the accessing signals which provides the enable signals to the sense amplifiers dependent on the conditions of the accessing lines. The enable signal is provided to the appropriate sense amplifier when the accessing signals are applied instead of applying the enable signal synchronously with respect to the system clock signal of the RAM. In one embodiment, the sense amplifier is a dynamic sense amplifier and the synchronous RAM is a synchronous static RAM (SRAM).

In one embodiment in which the synchronous RAM is designed to include global and sub-word lines and the array is divided into sections of columns, an enable signal is provided to a sense amplifier associated with each section in response to the detection of a selected GWL and a selected one of the associated SWLs for the given section. In this embodiment, each section has associated control logic. In one embodiment, the control logic for each section includes GWL signal detection logic for indicating when a GWL has been selected and also includes SWL signal detection logic for indicating when a SWL from a given section has been selected. A detect signal from each of the GWL and SWL detection logic are coupled to sense amplifier enable control logic which when the GWL and SWL have been selected and are detected by the GWL and SWL detection logic, the sense amplifier associated with the given section is enabled.

In one embodiment, the GWL detection logic includes for each GWL an inverter having its input coupled to one of the GWLs and its output coupled to the gate of a PMOS device. The drain of the PMOS device is coupled to VDD and the source of each PMOS device is coupled to a common GWL detection signal line for a given section which when any GWL is selected (i.e., accessed), the GWL detection signal line is pulled HIGH to VDD. The SWL detection logic includes for each given section an OR gate having its inputs coupled to the SWLs for the given section such that when one of the SWLs for the given section is selected the OR gate outputs a HIGH SWL detection signal. The GWL and SWL detection signal lines are coupled to the input of the sense amplifier enable logic which is an AND gate which when both inputs are HIGH, the enable logic outputs an enable signal to the sense amplifier for the given section. This embodiment also may include a reset circuit for resetting the enable signal to a low state after the sense amplifier reads the data from the memory which includes an NMOS device coupled between the GWL detection signal line and ground. The gate of the NMOS device can then be pulled LOW to reset the sense amplifier enable signal.

One embodiment, a circuit implementation combining the SWL detection logic and the sense amplifier enable logic includes a PMOS device coupled between a first working potential and a first node and having its gate coupled the GWL detection signal. The first node is also coupled to the input of an inverter which outputs the sense amplifier enable signal. A group of parallel NMOS devices are coupled between the first node and a second node, each having their gate coupled to one of the SWLs for the given section. Coupled between the second node and a second working potential is an NMOS device having its gate also coupled to the GWL detection signal. When the GWL detection signal is HIGH and at least one of the SWL lines are HIGH, the first node is pulled LOW and the circuit outputs a HIGH sense amplifier enable signal. If all of the SWLs are LOW or the GWL detection signal is LOW, then the circuit outputs a LOW enable signal. Hence the enable signal is only provided when one of the SWLs are selected and the GWL is selected for a given section.

A second embodiment of the GWL detect logic includes for each GWL an NMOS device having its gate coupled to the GWL, its source coupled to an inverted common GWL detection signal line for a given section and its drain coupled to ground. When the GWL is selected, the source of the NMOS device is pulled LOW and the GWL detection signal line transitions HIGH. This embodiment can also include a PMOS device coupled to the inverse of the common GWL detection signal line functioning as the reset circuit.

BRIEF DESCRIPTION OF THE DRAWINGS

FIG. 1A shows a prior art memory array using global word lines, sub-word lines and local word lines.

FIG. 1B shows selection logic for accessing local word lines in the array shown in FIG. 1A.

FIG. 2 shows a prior art fully differential dynamic sense amplifier.

FIG. 3 shows a functional block diagram of one embodiment of the present invention for providing an enable signal responsive to GWL and SWL accessing signals.

FIG. 4 shows a first logic block diagram of an embodiment of the present invention for providing an enable signal responsive to GWL and SWL accessing signals.

FIG. 5 shows a second logic block diagram of an embodiment of the GWL detection logic of the present invention and associated reset circuit.

FIG. 6 shows an embodiment of a circuit implementation of detection logic of the present invention.

DESCRIPTION OF PREFERRED EMBODIMENTS

FIG. 3 shows a first embodiment of a memory system which enables memory array sense amplifiers and particularly latched sense amplifiers at optimal times with respect to accessing signals. The memory system includes a global word line detection block (GWL detect 10) associated with each global word line, a sub-word line detection block (SWL detect 11) associated with each section or sense amplifier, and an enable sense amplifier block (enable logic 12) associated with each section or sense amplifier. The system further includes a global word line detection signal reset block (GWL detect reset 13). In accordance with the method and system of the present invention, a given GWL detect 10 detects when its corresponding GWL is selected and outputs a "GOL selected" signal onto its GWL signal detection line 14. Similarly, a given SWL detect 11 detects when one of its corresponding SWLs is selected. For instance, if any of the four SWL(0) signal lines are selected, then the SWL detect 11 associated with section 0 would output a "SWL selected" signal on the SWL signal detection line 15. If the GWL signal and one of the SWL signals for a given section are selected the enable logic 12 provides an enable signal on its output 16. The system also includes GWL detection signal line reset block (GVOL detect reset 13). This block de-asserts the "GWL select" signal so that the enable signals 16 are reset and ready for the next enable signal.

It should be noted that a single GWL signal detection line is used for two adjacent sections (i.e. section 0 and section 1), however, it should be understood that each of these sections can also have independent, GWL signal detection lines and logic. Alternatively, more than two sections may share a single GWL signal detection line and logic.

In operation, the system functions to provide the latched sense amplifier with an enable signal that tracks the GWL and SWL signals, instead of providing an enable signal synchronized to a system clock edge. The advantage of applying the enable signal dependent on the accessing signals is that the accessing signals are a close indicator as to the time that the data is ready to be accessed within the cells. In contrast, an enable signal synchronized to the system clock, is applied at a time that the data is predicted to be ready taking into account process and temperature variations. However, in the case in which a device falls out of predicted tolerances, this enable signal may not be applied at the appropriate time, or worse yet, may be delayed so as to increase the overall access times of the device.

In accordance with the system and method of the present invention, by using the accessing signals to determine when to apply the sense amplifier enable signal , the affects of processing variations and variations in temperature on the enable signal timing are reduced since the en able signal tracks the OWL and SWL signal lines and is consequently applied when the data is ready regardless of process and temperature variations.

FIG. 4 shows an embodiment of the system of the present invention implemented in logic elements in which GWL detect (block 10) includes an inverter (INV 20) having its input coupled to a GWL and its output coupled to the input of PMOS device (1)21). The source of P21 is coupled to VDD and the drain of P21 is coupled to GWL detection signal line 14 such that when LOW l is HIGH (i.e. selected), then P21 is on and pulls signal line 14 HIGH. The SWL detect (b)lock 11) is implemented with a multiple input OR gate 22 such that if any of the SWL signals coup led to its input is HIGH then the SWL detection signal line 15 is HIGH. The enable logic (b,lock 12) is implemented with AND gate 23 such that when both of the OWL and SWL detection signal lines 14 and 15 are HIGH then the enable signal line 16 is HIGH. The OWL detect reset (block 13) is embodied with an NMOS device N22 having its source coupled between the GWL detection signal line 14 and ground and having its gate coupled to a GWL reset signal. The GWL reset signal can be applied a predetermined time after the cell has been accessed.

FIG. 5 shows an other embodiment of the system of the present invention implemented in logic elements in which the GWL detect (block 10) includes an NMOS device having its drain coupled to the inverted GWL detection signal line 14', its source coupled to ground, and its gate coupled to one of the GWL lines. When the GWL line is selected (i.e. HIGH), N30 is on and pulls the inverted OWL detection signal line 14' LOW (i.e. to ground), and the GWL detection signal line 14 HIGH via INV 32. The GWL detect reset (block 13) is implemented using a PMOS device P31 having its source coupled to VDD, its drain couple to the inverted OWL detection signal line 14' and its gate coupled to the OWL reset signal such that when a LOW signal is applied to the gate of P31, the signal line 14' is pulled HIGH and signal line 14 transitions LOW thereby resetting enable signals 16.

FIG. 6 shows a circuit schematic of the combination of the SWL and enable blocks 11 and 12 shown in FIGS. 3–5. A PMOS device P40 has its source coupled to VDD, its drain coupled to node 1, and its gate coupled to the GWL detection signal line 14. Coupled between nodes 1 and 2 are a set of NMOS devices N41—one per SWL line for a given section—coupled in parallel having their drains commonly coupled to node 1, their sources commonly coupled to node 2, and their gates coupled to one of $SWL(O)_1$–$SWL(0)_4$. Device N42 has its drain coupled to node 2, its source coupled to ground, and its gate coupled to the GWL detection signal line 14. When the GWL detection signal line 14 is low (meaning the GWL is not selected), P40 is on and N42 is off such that node 1 is pulled HIGH and the enable signal 16 is LOW. In other words no matter what any of the SWL(0) signal lines are, enable 16 is LOW. When GWL detection signal line 14 is HIGH, P40 is off and N42 is on. In this case if any of the $SWL(O)_1$–$SWL(0)_2$ signal lines are HIGH, node 1 is pulled LOW and enable 16 is HIGH.

In the preceding description, specific details are set forth, such as the type of logic gates used, particular input conditions, and PMOS or NMOS device types in order to provide a thorough understanding of the present invention. It will be apparent, however, to one skilled in the art that these specific details need not be employed to practice the present invention. In other instances, well-known device theory has not been described in detail in order to avoid unnecessarily obscuring the present invention.

Moreover, although the elements of the present invention have been described in conjunction with certain embodiments, it is appreciated that the invention can be implemented in a variety of other ways. Consequently, it is to be understood that the particular embodiment shown and described by way of illustration is in no way intended to be considered limiting. Reference to the details of this embodiment is not intended to limit the scope of the claims which themselves recite only those features regarded as essential to the invention.

What is claimed is:

1. An apparatus for enabling sense amplifiers in a synchronous RAM (SRAM). said SRAM including an array of memory cells for storing data and an accessing portion for accessing said data in each memory cell using a global word line (GWL) accessing signal transmitted on a corresponding GWL and a sub-word line (SWL) accessing signal transmitted on a corresponding SWL, each memory cell in said array having an associate sense amplifier, said apparatus comprising:

a means for detecting said GWL accessing signal and providing a GWL detection signal, said GWL accessing signal detection means including an inverter having its input coupled to said corresponding GWL and its output coupled to the gate of a PMOS device, said PMOS device having its source coupled to a first power supply and its drain commonly coupled to a GWL detection signal line with other PMOS device drains associated with other of said GWLs;

and a means for detecting said SWL accessing signal and providing a SWL detection signal;

a means responsive to said GWL detection signal and said SWL detection signal for providing an enable signal to said associated sense amplifier when said each cell is accessed, wherein said enable signal tracks said GWL and SWL accessing signals.

2. The apparatus as described in claim 1 wherein said SWL detection means comprises an OR gate having a set of SWLs associated with a given sense amplifier coupled to its input, said OR gate outputting said SWL detection signal.

3. The apparatus as described in claim 1 wherein said means for providing said enable signal comprises an AND gate having a first input coupled to said GWL detection signal, a second input coupled to said SWL detection signal and an output for providing said enable signal.

4. An apparatus for enabling sense amplifiers in a synchronous RAM (SRAM), said SRAM including an array of memory cells for storing data and an accessing portion for accessing said data in each memory cell using a global word line (GWL) accessing signal transmitted on a corresponding GWL and a sub-word line (SWL) accessing signal transmitted on a corresponding SWL, each memory cell in said array having an associate sense amplifier, said apparatus comprising:

a means for detecting said GWL accessing signal and providing a GWL detection signal, said GWL accessing signal detection means including a NMOS device having its gate coupled to said corresponding GWL, its drain coupled to a first power supply, and its source commonly coupled to a common node with the sources of other NMOS devices having their gates coupled to other of said GWLs and an inverter having its input coupled to said common node and its output coupled to a GWL detection signal line and a means for detecting said SWL accessing signal and providing a SWL detection signal;

a means responsive to said GWL detection signal and said SWL detection signal for providing an enable signal to said associated sense amplifier when said each cell is accessed;

wherein said enable signal tracks said GWL and SWL accessing signals.

5. The apparatus as described in claim 4 wherein said SWL detection means comprises an OR gate having a set of SWLs associated with a given sense amplifier coupled to its input, said OR gate outputting said SWL detection signal.

6. The apparatus as described in claim 4 wherein said means for providing said enable signal comprises an AND gate having a first input coupled to said GWL detection signal, a second input coupled to said SWL detection signal and an output for providing said enable signal.

* * * * *